US012188965B2

(12) United States Patent
Hortans et al.

(10) Patent No.: US 12,188,965 B2
(45) Date of Patent: Jan. 7, 2025

(54) SHUNT RESISTOR FOR A CURRENT MEASUREMENT APPARATUS OF A BUSBAR, CURRENT MEASUREMENT APPARATUS AND BUSBAR

(71) Applicant: Vacon Oy, Vaasa (FI)

(72) Inventors: Magnus Hortans, Sundom (FI); Trygve Björkgren, Kvevlax (FI)

(73) Assignee: VACON OY, Vaasa (FI)

( * ) Notice: Subject to any disclaimer, the term of this patent is extended or adjusted under 35 U.S.C. 154(b) by 222 days.

(21) Appl. No.: 18/064,055

(22) Filed: Dec. 9, 2022

(65) Prior Publication Data

US 2023/0184811 A1 Jun. 15, 2023

(30) Foreign Application Priority Data

Dec. 13, 2021 (DE) .......................... 102021214268.0

(51) Int. Cl.
*G01R 15/14* (2006.01)
*G01R 1/20* (2006.01)
(Continued)

(52) U.S. Cl.
CPC .......... *G01R 15/146* (2013.01); *G01R 1/203* (2013.01); *G01R 19/0092* (2013.01); *G01R 15/00* (2013.01); *H01C 1/14* (2013.01)

(58) Field of Classification Search
CPC ...... G01R 15/00; G01R 15/14; G01R 15/146; G01R 19/00; G01R 19/0084;
(Continued)

(56) References Cited

U.S. PATENT DOCUMENTS

| 4,825,153 A | * | 4/1989 | Malewski | .............. | G01R 1/203 338/49 |
| 11,293,952 B2 | | 4/2022 | Mueller et al. | | |

(Continued)

FOREIGN PATENT DOCUMENTS

| CN | 102640233 A | * | 8/2012 | ............. | G01R 1/203 |
| CN | 114556114 A | * | 5/2022 | ............. | G01R 1/203 |

(Continued)

*Primary Examiner* — Hoai-An D. Nguyen
(74) *Attorney, Agent, or Firm* — McCormick, Paulding & Huber PLLC

(57) ABSTRACT

The invention pertains to a shunt resistor for a current measurement apparatus of a busbar, the resistor having a planar resistor body and two connection terminals for measuring voltage across the planar resistor body, wherein each of the two connection terminals is connected to one of two conductive traces provided on opposite sides of the resistor body, and wherein each of the conductive traces includes a measurement portion and a connection portion for connecting the measurement portion to one of the connection terminals. The invention is also directed at a current measurement apparatus including said shunt resistor and a current path provided in parallel to the shunt resistor. The invention is furthermore directed at a busbar with a corresponding current measurement apparatus, wherein the shunt resistor and the current path are provided for connecting the busbar to an electronic component.

20 Claims, 7 Drawing Sheets
(6 of 7 Drawing Sheet(s) Filed in Color)

(51) Int. Cl.
*G01R 15/00* (2006.01)
*G01R 19/00* (2006.01)
*H01C 1/14* (2006.01)

(58) Field of Classification Search
CPC ........ G01R 19/0092; G01R 1/00; G01R 1/20; G01R 1/203; H01C 1/00; H01C 1/14
USPC .............................................. 324/76.11, 126
See application file for complete search history.

(56) References Cited

U.S. PATENT DOCUMENTS 11,789,044 B2 * 10/2023 Matsuda ................ G01R 1/203
  324/76.11
2015/0192622 A1 * 7/2015 Sato .................. G01R 19/0092
  324/126

FOREIGN PATENT DOCUMENTS

| | | | | |
|---|---|---|---|---|
| DE | 102011121902 A1 | 6/2013 | | |
| DE | 112013000968 T5 * | 11/2014 | ............. | G01R 1/203 |
| DE | 102019203496 B3 | 7/2020 | | |
| FI | 10219 | 9/2013 | | |
| WO | WO-2015060102 A1 * | 4/2015 | ............. | G01R 1/203 |

* cited by examiner

SHUNT RESISTOR FOR A CURRENT MEASUREMENT APPARATUS OF A BUSBAR, CURRENT MEASUREMENT APPARATUS AND BUSBAR

CROSS-REFERENCE TO RELATED APPLICATION

This application claims foreign priority benefits under U.S.C. § 119 from German Patent Application No. 102021214268.0, filed Dec. 13, 2021, the content of which is hereby incorporated by reference in its entirety.

TECHNICAL FIELD

The invention pertains to a shunt resistor for a current measurement apparatus of a busbar, the resistor comprising a planar resistor body and say two connection terminals for measuring voltage across the planar resistor body, wherein each of the two connection terminals is connected to one of two conductive traces provided on opposite sides of the resistor body, and wherein each of the conductive traces comprises a measurement portion and a connection portion for connecting the measurement portion to one of the connection terminals. The invention is also directed at a current measurement apparatus comprising said shunt resistor and a current path provided in parallel to the shunt resistor. The invention is furthermore directed at a busbar with a corresponding current measurement apparatus, wherein the shunt resistor and the current path are provided for connecting the busbar to an electronic component.

BACKGROUND

Known solutions for measuring currents and in particular short circuit currents in busbars comprise big and expensive closed-loop current transducers. The known solutions rely on desaturation protection. Typically, this means that short circuit protection occurs delayed and short circuit currents cannot be guaranteed to remain sufficiently low to avoid damage to components connected to the busbar.

Furthermore, the known solutions may be based on indirect current measurement through magnetic field sensing. They may therefore not be ideal for measuring low-frequency currents, i.e. normal 50/60 Hz currents, as magnetic fields from adjacent busbars may distort the measurement. This is shown in FIGS. 6a-6b. Although this could be compensated mathematically, assuming symmetrical three-phase current waveforms, abnormal events such as short circuits would still be difficult to measure.

SUMMARY

The aim of the invention is to provide an improved device for measuring currents in a busbar, wherein the device is compact and can measure both, low-frequency currents, and short circuits accurately.

This aim is achieved by a shunt resistor according to claim 1, a current measurement apparatus according to claim 9 and a bus bar according to claim 10.

According to claim 1, a shunt resistor for a current measurement apparatus of a busbar is provided. The resistor comprises a planar resistor body and two connection terminals for measuring voltage across the planar resistor body, wherein each of the two connection terminals is connected to one of two conductive traces provided on opposite sides of the resistor body, and wherein each of the conductive traces comprises a measurement portion and a connection portion for connecting the measurement portion to one of the connection terminals. The presently described shunt resistor offers a compact and generally applicable solution for measuring currents in a busbar.

In a preferred embodiment of the invention, the measurement portion is a linear and/or horizontal portion of the conductive trace and/or is provided at a bottom or upper part of the resistor body. Generally speaking, the measurement portion of each conductive trace may be positioned such that it is located in a place, where a maximum current flow may be expected during operation of the resistor. This increases the sensitivity of the measurements performed using the shunt resistor.

In another preferred embodiment of the invention, the connection portion is connected to the middle of the measurement portion. Each conductive trace may comprise a measurement portion, which is connected to its connection terminal via the corresponding connection portion. The connection portion makes it possible to space apart the connection port from the measurement portion. Therefore, the measurement portion can be provided in an area, in which the measurement sensitivity is optimised, whereas the connection portion may be provided in an area, which facilitates the connection of the shunt resistor to further components.

In another preferred embodiment of the invention, the connection portions and/or the measurement portions of the two conductive traces are arranged in symmetry to each other. The symmetry between the corresponding portions of the two conductive traces may be mirror symmetry with respect to a central plane of the resistor body. The measurement portions may be oriented horizontally, and/or at least a part of the connection portions may be oriented vertically and/or horizontally and/or perpendicular to the measurement portion and/or at an angle smaller than 90° with respect to the measurement portion.

In another preferred embodiment of the invention, the connection terminals are provided at an upper or bottom part of the resistor body and/or opposite the measurement portions. The measurement portions may be spaced apart from the connection terminals and arranged at the resistor body at or close to a maximum possible distance. This ensures that no interference occurs between an electric connection attached to the connection terminals and the measurement portions. Furthermore, it ensures that the surface area of the resistor body is used as efficiently as possible.

In another preferred embodiment of the invention, the resistor body is enveloped in a non-conductive material/insulator. The term non-conductive material is understood in a broad term and may refer to a material with lower conductivity then that of an electric conductor connected to the resistor body or the complete shunt resistor. The conductivity of the non-conductive material may be smaller than the conductivity of the conductor by e.g. ten or several tens of percent or by one or more orders of magnitude. The resistor body may be enveloped such that three of its sides are at least partially covered by and/or in contact with the non-conductive material.

In a particularly preferred embodiment of the invention, the non-conductive material enveloping the resistor body covers two principal faces and a bottom edge of the resistor body, and the non-conductive material enveloping the resistor body exposes the connection terminals. The bottom edge of the resistor may be defined as the edge close to which the measurement portions are provided. The two principle faces of the resistor body may be two opposing faces with the greatest surface areas of all faces of the resistor body.

In another preferred embodiment of the invention, the resistor body has a rectangular shape. The shape may not be limited to a square shape but can be any shape e.g. round, oval, rectangular with or without rounded edges.

The invention is also directed at a current measurement apparatus according to claim 9. The current measurement apparatus comprises a shunt resistor as presently described, and a current path provided in parallel to the shunt resistor. The shunt resistor may be connected to any further device required for providing current measurements.

The invention is also directed at a busbar with a corresponding current measurement apparatus, wherein the shunt resistor and the current path are provided for connecting the busbar to an electronic component.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Further details and advantages of the invention are described with reference to the figures. The figures show.

DETAILED DESCRIPTION

Figure 1:
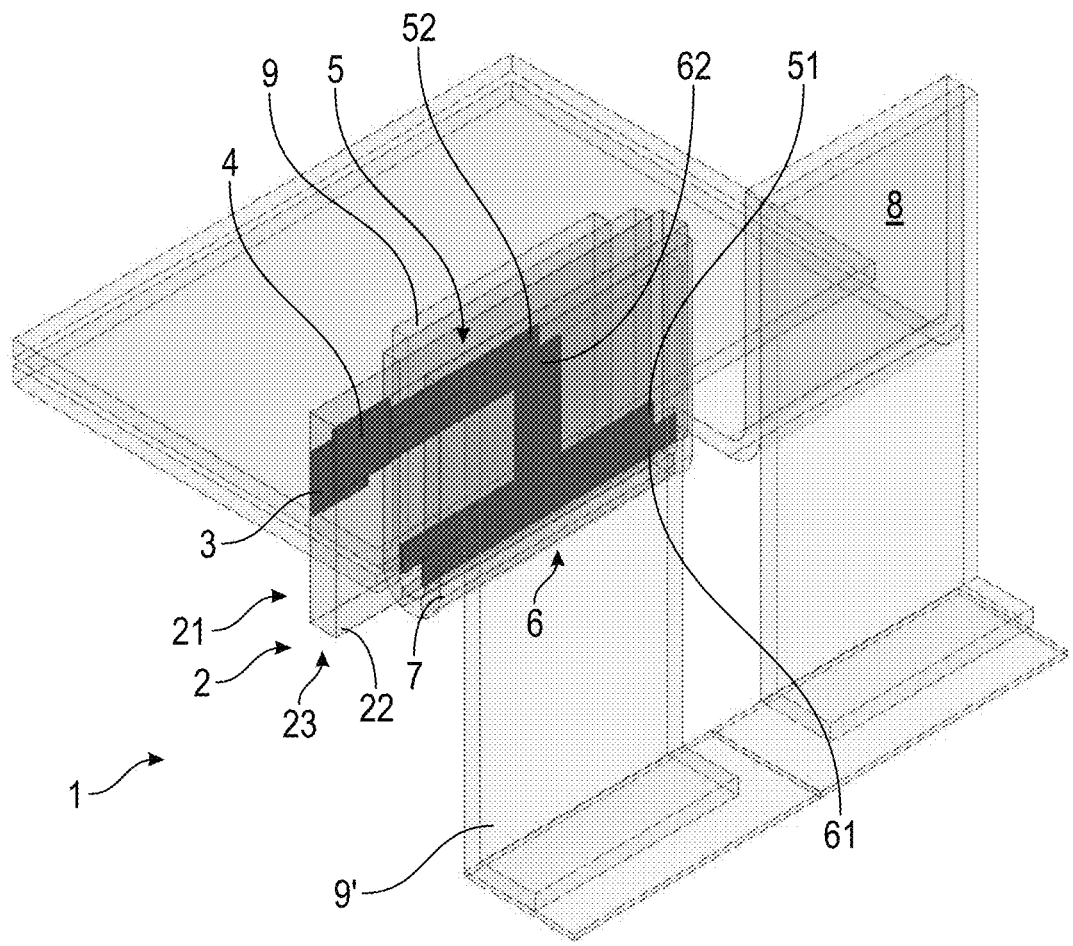
FIG. 1: a wire frame view of the shunt resistor according to the invention.

FIG. 1 is a wire frame view of the shunt resistor 1 according to the invention. The shunt resistor 1 is provided for a current measurement apparatus of a busbar. The busbar and further components of the measurement apparatus are not shown in FIG. 1. The resistor 1 comprises a planar resistor body 2, which is shown oriented vertically in FIG. 1. The resistor body 2 may be made of any suitable material of sufficiently low conductivity.

The resistor 1 comprises two connection terminals 3, 4 for measuring voltages across the planar resistor body 2. The two connection terminals are provided on opposite sides of the resistor body 2.

Each of the two connection terminals 3, 4 is connected to one of two conductive traces 5, 6, also provided on opposite sides of the resistor body 2. Each of the conductive traces 5, 6 comprises a measurement portion 51, 61 and a connection portion 52, 62 for connecting the measurement portion 51, 61 to one of the connection terminals 3, 4. The two conductive traces 5, 6 are separated electrically from each other by the resistor body 2.

The measurement portions 51, 61 are shown to be linear and horizontal portions of the conductive trace 5, 6 and/or are provided at a bottom part of the resistor body 2. The measurement portions 51, 61 may extend over the entire width of the resistor body 2. The measurement portions 51, 61 may extend over a smaller portion of the resistor body 2. However, it is advantageous for the measurement portions 51, 61 to cover a considerable portion of the resistor body's 2 width.

In order to improve the accuracy of the current measurement, the connection portion 52, 62 may advantageously be connected to the middle of the measurement portion 51, 61. The connection portions 52, 62 may comprise a bend and two linear sub-portions connected by said bend. The sub-portions of the connection portions 52, 62 may be at a perpendicular angle with respect to each other.

In the shown embodiment, the connection portions 52, 62 and the measurement portions 51, 61 of the two conductive traces 5, 6 are arranged in symmetry to each other. Thus, the conductive traces 5, 6 may be arranged at least partially opposite each other and at or within opposite sides of the resistor body 2.

The connection terminals 3, 4 are provided at an upper part of the resistor body 2 and opposite the measurement portions 51, 61. The two connection terminals 3, 4 may not be arranged symmetrically with respect to each other in order to facilitate attaching some electric components to the connection terminals 3, 4. However, the connection terminals 3, 4 may be arranged such that they overlap at least partially when viewed in a direction perpendicular to the resistor body 2.

The resistor body 2 may be enveloped in a non-conductive material 7. The non-conductive material 7 may be provided between two conductors 9, 9'. The two conductors 9, 9' connect the resistor 1 electrically to say a busbar and some electronic requiring the busbar connection. The resistor body 2 may have a rectangular shape.

Figure 2:
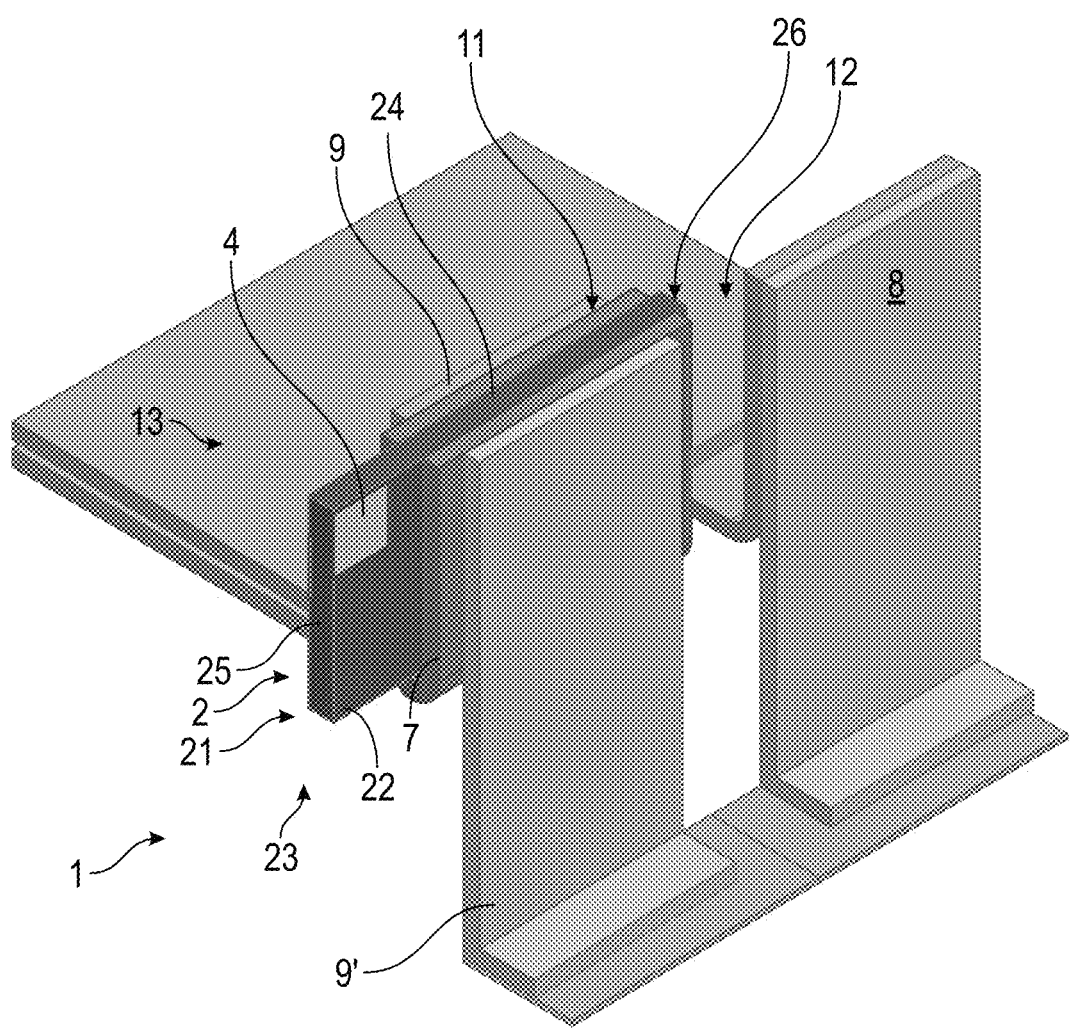
FIG. 2: a perspective view of the shunt resistor according to the invention.

As shown in FIG. 2, the non-conductive material 7 does not cover all of the resistor body 2. The non-conductive material 7 covers most of two principal faces 21, 22 and some or most of a bottom edge 23 of the resistor body 2. The first principal face 21 and the bottom edge 23 are not visible in FIG. 2 as they are oriented away from the viewer. They are indicated by reference numbers 21 and 23 accordingly.

The non-conductive material 7 may be in contact with the bottom edge 23 of the resistor body 2 or there may be a gap between the non-conductive material 7 and the bottom edge 23. The non-conductive material 7 may comprise a U-shaped portion, in which the bottom edge 23 of the resistor body 2 or some other portion of the resistor body 2 is at least partially contained. The non-conductive material 7 exposes the connection terminals 3, 4 and a corresponding portion of the resistor body 2. The non-conductive material 7 further exposes an upper edge 24 opposite the measurement portions 51, 61 and/or left and right side edges 25, 26 of the resistor body 2. The measurement portions 51, 61 are shown in FIG. 1 and are situated close to the bottom U-shaped portion of the non-conductive material 7.

The sandwich structure of the resistor 1 is clearly recognisable in FIG. 2. The innermost part of the resistor 1 comprises the resistor body 2. The resistor body 2 is enveloped by the non-conductive material 7 at its two principal and opposing faces 21, 22 end the bottom edge 23. The two conductors 9, 9' form the outermost layer of the sandwich structure.

The upper portion 11 of the sandwich structure shows a total of five layers arranged adjacent and parallel to each other. The outermost layers comprise the two conductors 9, 9'. The two conductors 9, 9' are in contact with the non-conductive material 7, which in return envelops the resistor body 2. The upper portion 11 of the resistor's 1 sandwich structure may be planar, such that the upper edges of the five layers forming the sandwich structure are arranged coplanar to each other.

The resistor 1 may comprise two side portions 12, 13, a right side portion 12 end a left side portion 13. The left side portion 13 may comprise the connection terminals 3, 4. The connection terminal 3 is positioned opposite connection terminal 4 and is oriented away from the viewer. It is therefore not visible in FIG. 2. The left and right side of the resistor 1 may be oriented in the horizontal direction of the resistor 1.

The two side portions 12, 13 may comprise stepped sub-portions formed by the previously mentioned layers of the sandwich structure. The resistor body 2 may form the innermost layer of the sandwich structure and at the same time represent the outermost step of the sandwich structure. In other words, the resistor body 2 may extend furthest in a horizontal direction of the resistor 1 while being the innermost component of the sandwich structure.

The conductors 9, 9' may extend the least in a horizontal direction out of all the components of the sandwich structure. The non-conductive material 7 may extend further in a horizontal direction than the conductors 9, 9' but less than the resistor body 2.

Of the components of the sandwich structure, at least one of the conductors 9, 9' may extend the furthest in a vertical direction thereof. The resistor body 2 may extend the least in a vertical direction of the sandwich structure. The non-conductive material 7 may extend further in a vertical direction than the resistor body 2 but less than at least one of the conductors 9, 9'.

A current measurement apparatus may comprise the shunt resistor 1 and a current path 8 provided in parallel to the shunt resistor 1. Both, the resistor 1 and the current path 8, may electrically connect an electronic component to the busbar. The measurement apparatus may further comprise any additional device required for providing current measurements.

The current measurement apparatus and therefore the shunt resistor 1 may be integrated with a busbar, wherein the shunt resistor 1 and the current path 8 are provided for connecting the busbar to an electronic component.

The sandwiched conductors 9, 9' in which current may flow between 9, 9', may force the electromagnetic field to be homogeneous and stay in between the conductors 9, 9'. The electromagnetic field within the sandwiched layers of FIG. 2 may not affect any measurement of say current flowing between 9, 9'.

In the resistive part of say measurement portions 51, 61 a voltage may be measured as result of the current flowing through measurement portions 51, 61. The measurement portions 51, 61 are shown in FIG. 1 and may be made using high precision metallurgy techniques to obtain low tolerances at wide temperature ranges. The resulting static R resistance value may be used to estimate current using Ohm's law.

The connection terminal 3, the measurement portion 51, and the connection portion 52 may be symmetrical placed adjacent to connection terminal 4, the measurement portion 61 and/or the connection portion 62 shown in FIG. 1. The symmetrical arrangement of portions 3, 51, 52 adjacent to portions 4, 61, 62, may ensure a precise voltage measurement due to the symmetric current distribution in the arrangement. The symmetrical arrangement may assist precise voltage measurement even during short circuit situations leading to high current flowing through the arrangement, moreover current flowing though the conductors 9, 9'.

Figure 3:
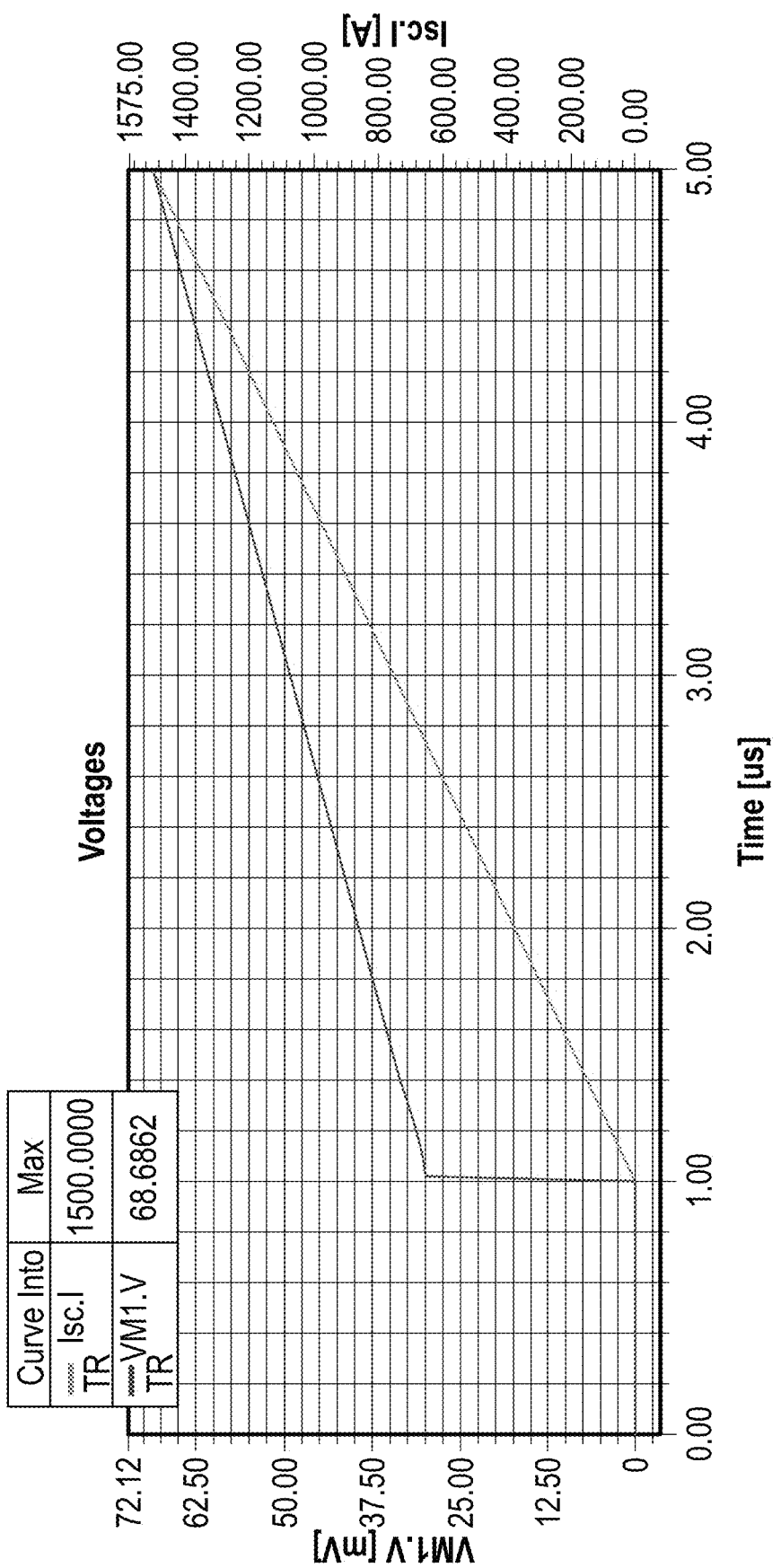
FIG. 3: a graph of simulated shunt resistor voltages.

FIG. 3 is a graph of simulated shunt resistor voltages for a short circuit current equal to 1500 A in 4 µs. Due to the specific architecture of the shunt resistor 1, the shunt resistor 1 is able to measure the dynamic short circuit event accurately with a linear voltage slope increasing as a function of current. The traces or previously shown conductors 9, 9' connecting the shunt resistor 1 to the electrical wires are sandwiched in order to minimize stray inductance and noise susceptibility. The initial jump in voltage is due to the parasitic inductance across the shunt, L=Vjump/di/dt=0 mV/1500 A/4 µs=80 pH, which is very low. This step voltage change causes an offset, which may give an early detection of possible short circuit events together with the following observation of linearly increasing voltage across the shunt resistor 1.

Figure 4A:
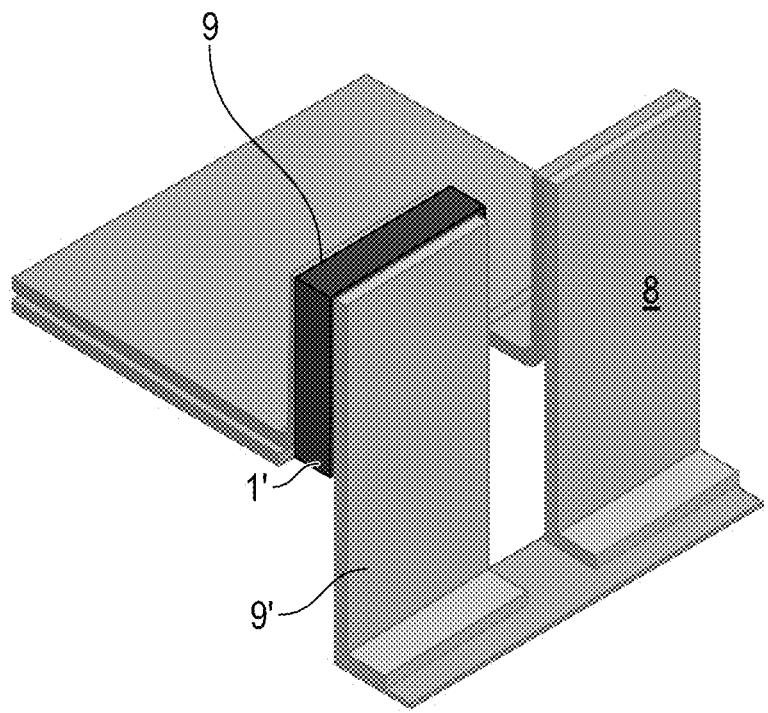
FIGS. 4*a*-4*b*: perspective views of known shunt resistors.
Figure 4B:
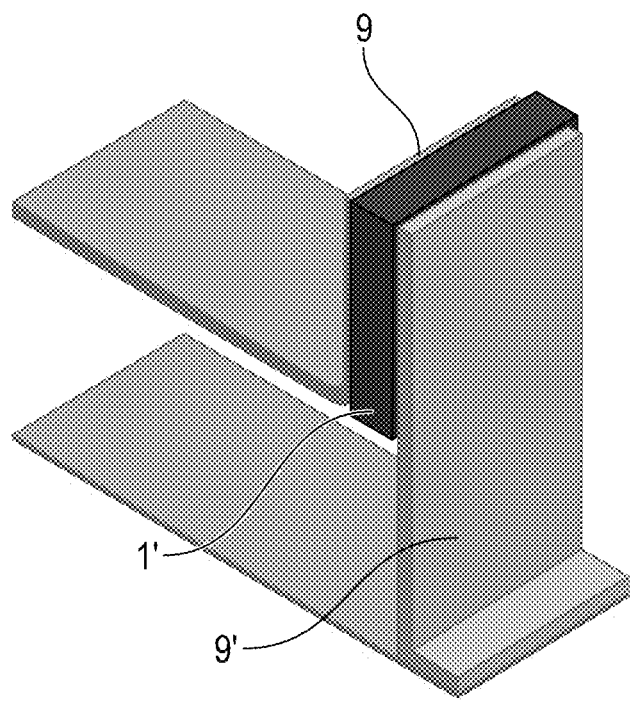

FIGS. 4a and 4b are perspective views of known shunt resistors 1'. FIG. 4a refers to a simulation model of a known shunt resistor 1' for a DC+ to DC− short circuit and FIG. 4b refers to a simulation model of a known shunt resistor 1' for a DC− to ground short circuit. The known shunt resistor 1' is provided between a busbar and a device supplied by the busbar in both cases of FIGS. 4a and 4b. However, in the example of FIG. 4a, an additional current path 8 is provided between the device and the busbar.

Figure 5B:
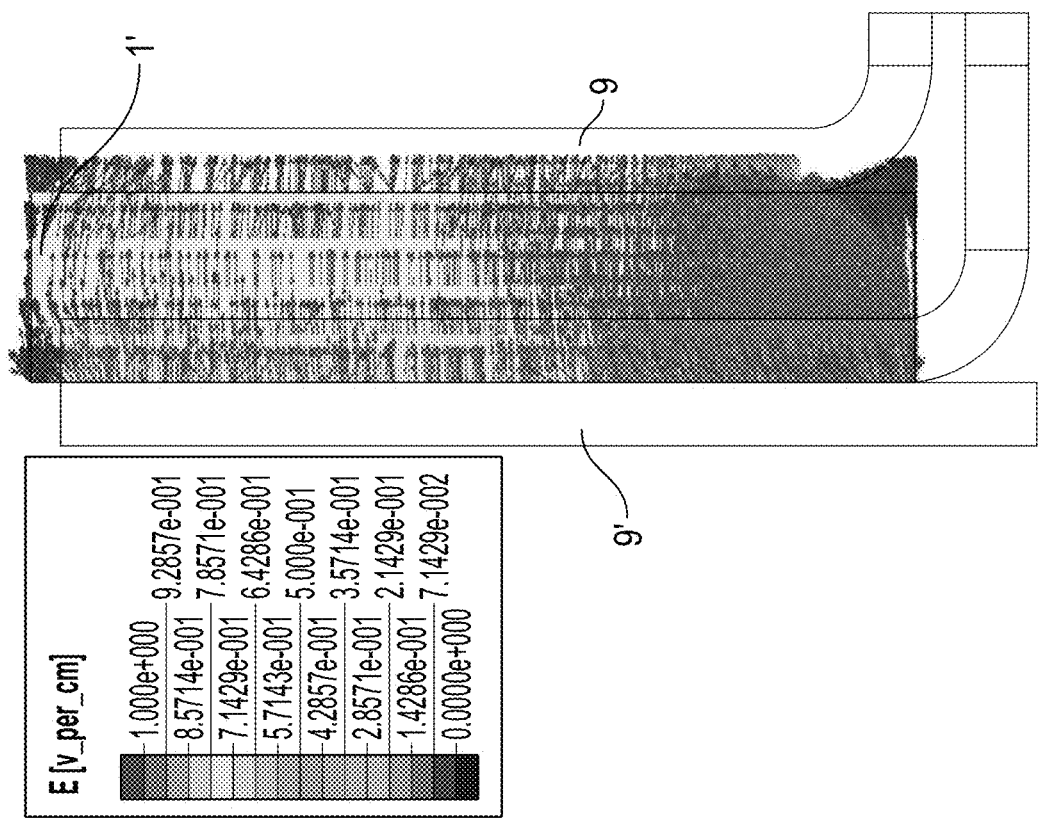
FIGS. 5*a*-5*b*: electric fields in known shunt resistors.
Figure 5A:
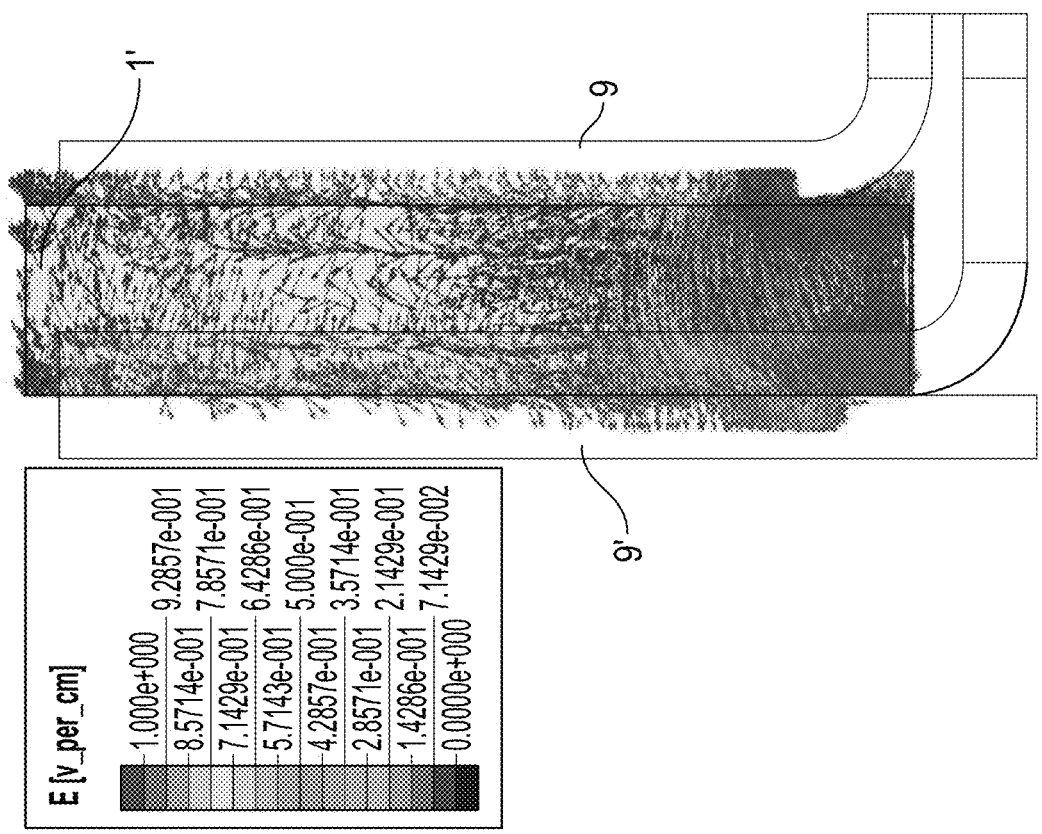

In the known shunt resistors 1', the short circuit current does not flow homogenously through said known shunt resistors 1' due to skin and proximity effects. This is illustrated in FIGS. 5a and 5b, wherein the known plate-shaped shunt resistor 1' is mounted to the DC link terminals between conductors 9, 9'. The same principle also holds if the resistor 1' is placed on the AC-side of an inverter module. FIG. 5a shows the electric field in the known shunt resistor 1' for a 1500 A DC+ to DC− short circuit at 1 MHz and FIG. 5b at 1 kHz.

Figures 6A, 6B:
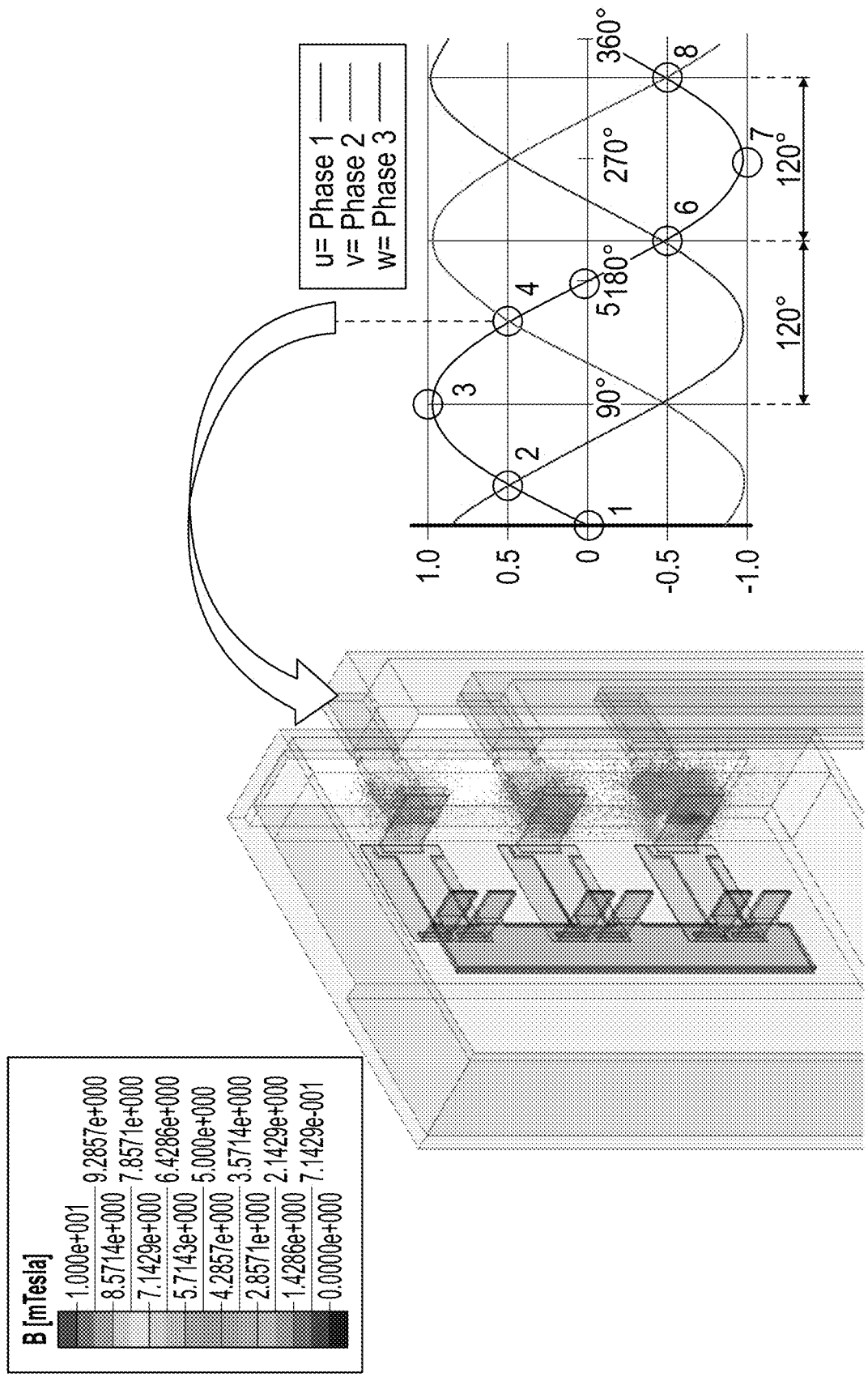
FIGS. 6*a*-6*b*: busbars in compact three-phase inverter and corresponding diagram.

FIGS. 6a and 6b show busbars in a compact three-phase inverter and a corresponding voltage diagram. Current measurements in such situations may typically be based on magnetic field sensing. In a compact three-phase inverter, the busbars and sensors are placed close together and the magnetic field of the neighbouring phases will affect the sensor measurement. The measured current is dependent both, on sensor positioning and current in adjacent phases. Hence, u-phase and v-phase should, but are not measuring equal magnetic field amplitudes, for example in point 4 of FIG. 6b.

Figure 7:
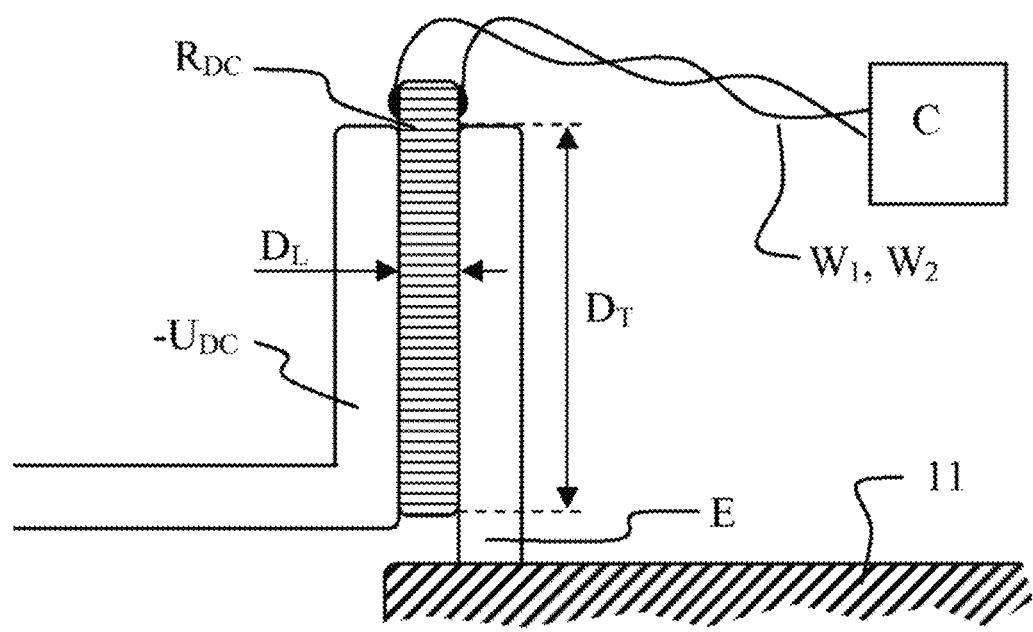
FIG. 7: a shunt resistor Roc according to the state of the art.

FIG. 7 is prior art FI 10219 where short circuit current is not flowing homogenously through the shunt resistor $R_{DC}$ due to skin proximity effects. The present invention comprising conductive traces 5, 6 shown in FIG. 1 overcomes the associated measurement limitations of the prior art.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:
1. A shunt resistor for a current measurement apparatus of a busbar, the resistor comprising a planar resistor body and two connection terminals for measuring voltage across the planar resistor body, wherein each of the two connection terminals is connected to one of two conductive traces provided on opposite sides of the resistor body, and wherein each of the conductive traces comprises a measurement portion and a connection portion for connecting the measurement portion to one of the connection terminals.

2. The shunt resistor according to claim 1, wherein the measurement portion is a linear and/or horizontal portion of the conductive trace and/or is provided at a bottom or upper part of the resistor body.

3. The shunt resistor according to claim 1, wherein the connection portion is connected to the middle of the measurement portion.

4. The shunt resistor according to claim 1, wherein the connection portions and/or the measurement portions of the two conductive traces are arranged in symmetry to each other.

5. The shunt resistor according to claim 1, wherein the connection terminals are provided at an upper or bottom part of the resistor body and/or opposite the measurement portions.

6. The shunt resistor according to claim 1, wherein the resistor body is enveloped in a non-conductive material.

7. The shunt resistor according to claim 6, wherein the non-conductive material enveloping the resistor body covers two principal faces and a bottom edge of the resistor body, and that the non-conductive material enveloping the resistor body exposes the connection terminals.

8. The shunt resistor according to claim 1, wherein the resistor body has a rectangular shape.

9. A current measurement apparatus comprising the shunt resistor according to claim 1, and a current path provided in parallel to the shunt resistor.

10. A busbar with the current measurement apparatus according to claim 9, wherein the shunt resistor and the current path are provided for connecting the busbar to an electronic component.

11. The shunt resistor according to claim 2, wherein the connection portion is connected to the middle of the measurement portion.

12. The shunt resistor according to claim 2, wherein the connection portions and/or the measurement portions of the two conductive traces are arranged in symmetry to each other.

13. The shunt resistor according to claim 3, wherein the connection portions and/or the measurement portions of the two conductive traces are arranged in symmetry to each other.

14. The shunt resistor according to claim 2, wherein the connection terminals are provided at an upper or bottom part of the resistor body and/or opposite the measurement portions.

15. The shunt resistor according to claim 3, wherein the connection terminals are provided at an upper or bottom part of the resistor body and/or opposite the measurement portions.

16. The shunt resistor according to claim 4, wherein the connection terminals are provided at an upper or bottom part of the resistor body and/or opposite the measurement portions.

17. The shunt resistor according to claim 2, wherein the resistor body is enveloped in a non-conductive material.

18. The shunt resistor according to claim 3, wherein the resistor body is enveloped in a non-conductive material.

19. The shunt resistor according to claim 4, wherein the resistor body is enveloped in a non-conductive material.

20. The shunt resistor according to claim 5, wherein the resistor body is enveloped in a non-conductive material.

* * * * *